(12) United States Patent
Xie et al.

(10) Patent No.: US 9,411,237 B2
(45) Date of Patent: Aug. 9, 2016

(54) RESIST HARDENING AND DEVELOPMENT PROCESSES FOR SEMICONDUCTOR DEVICE MANUFACTURING

(71) Applicant: Applied Materials, Inc., Santa Clara, CA (US)

(72) Inventors: Peng Xie, Fremont, CA (US); Christopher Dennis Bencher, Cupertino, CA (US); Huixiong Dai, San Jose, CA (US); Timothy Michaelson, Milpitas, CA (US); Subhash Deshmukh, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 14/205,324

(22) Filed: Mar. 11, 2014

(65) Prior Publication Data

US 2014/0263172 A1 Sep. 18, 2014

Related U.S. Application Data

(60) Provisional application No. 61/786,056, filed on Mar. 14, 2013.

(51) Int. Cl.
*G03F 7/40* (2006.01)
*G03F 7/36* (2006.01)

(52) U.S. Cl.
CPC . *G03F 7/405* (2013.01); *G03F 7/36* (2013.01)

(58) Field of Classification Search
CPC .......................................................... G03F 7/26
See application file for complete search history.

(56) References Cited

U.S. PATENT DOCUMENTS

| 4,921,778 | A | 5/1990 | Thackeray et al. |
| 5,108,875 | A | 4/1992 | Thackeray et al. |
| 5,275,920 | A | 1/1994 | Sezi et al. |
| 6,436,605 | B1 | 8/2002 | Angelopoulos et al. |
| 6,497,996 | B1 | 12/2002 | Naya et al. |

(Continued)

FOREIGN PATENT DOCUMENTS

| EP | 0100079 A3 | 2/1984 |
| JP | H07191465 | 7/1995 |

(Continued)

OTHER PUBLICATIONS

Yu-Chih Tseng, et. al., "Enhanced polymeric lithography resists via sequential infiltration synthesis", J. Mater. Chem., 2011, 21, 11722.

(Continued)

*Primary Examiner* — Kathleen Duda
(74) *Attorney, Agent, or Firm* — Dugan & Dugan, PC

(57) ABSTRACT

In some embodiments, a method of forming an etch mask on a substrate is provided that includes (1) forming a resist layer on a substrate; (2) exposing one or more regions of the resist layer to an energy source so as to alter at least one of a physical property and a chemical property of the exposed regions; (3) performing a hardening process on the resist layer to increase the etch resistance of first regions of the resist layer relative to second regions of the resist layer, the hardening process including exposing the resist layer to one or more reactive species within an atomic layer deposition (ALD) chamber; and (4) dry etching the resist layer to remove the one or more second regions and to form a pattern in the resist layer. Other embodiments are provided.

18 Claims, 5 Drawing Sheets

(56) References Cited

U.S. PATENT DOCUMENTS

| | | | |
|---|---|---|---|
| 8,048,325 B2 | 11/2011 | Balasubramaniam et al. | |
| 2004/0033445 A1* | 2/2004 | Lee | G03F 7/405 430/313 |
| 2010/0081285 A1 | 4/2010 | Chen et al. | |
| 2011/0159253 A1 | 6/2011 | Kang et al. | |
| 2011/0300711 A1* | 12/2011 | Martin | G03F 7/40 438/696 |

FOREIGN PATENT DOCUMENTS

| | | |
|---|---|---|
| JP | H08062860 | 3/1996 |
| KR | 10-2010-0035559 | 4/2010 |

OTHER PUBLICATIONS

Qing Peng et al., "Nanoscopic Patterned Materials with Tunable Dimensions via Atomic Layer Deposition on Block Copolymers," Adv. Mater. 2010, 22, 5129-5133.

Ashwini Sinha et al., "A Top Surface Imaging Method Using Area Selective ALD on Chemically Amplified Polymer Photoresist Films," Electrochem. Solid-State Lett., 2006, vol. 9, issue 11, G330-G333.

International Search Report and Written Opinion of International Application No. PCT/US2014/023612 mailed Aug. 14, 2014.

International Preliminary Report on Patentability and Written Opinion of International Application No. PCT/US2014/023612 mailed Sep. 24, 2015.

* cited by examiner

RESIST HARDENING AND DEVELOPMENT PROCESSES FOR SEMICONDUCTOR DEVICE MANUFACTURING

RELATED APPLICATIONS

The present application claims priority to U.S. Provisional Application 61/786,056 filed Mar. 14, 2013, and entitled "RESIST HARDENING AND DEVELOPMENT PROCESSES FOR SEMICONDUCTOR DEVICE MANUFACTURING", which is hereby incorporated by reference herein for all purposes.

FIELD

The present invention generally relates to semiconductor device manufacturing, and more particularly is directed to patterning process (lithography) methods and apparatus.

BACKGROUND

Lithography technology has been one of the key enablers and drivers for the semiconductor industry for the past several decades. Lithography improvements have kept the cost for printing a silicon wafer roughly constant while exponentially reducing the transistor size, therefore dramatically increasing the number of transistors that can be printed per chip at a rate known as Moore's law. Integrated circuits (ICs) have been printed optically with improvements in lens and imaging material technology along with decreases in wavelength used, fueling the steady improvement of lithography technology. However, the end of optical lithography technology has been predicted by many and for many years.

Many technologies have been proposed and developed to improve on the performance of optical lithography. Some succeeded; but the cost and complexity grew rapidly. This has been true largely because it has been more economical to advance incremental improvements in the existing optical technology rather than displace it with a new one. What are needed are methods and apparatus for improving the performance of lithography without making the process non-economical or impracticable for production.

SUMMARY

In some embodiments, a method of forming an etch mask on a substrate is provided that includes (1) forming a resist layer on a substrate; (2) exposing one or more regions of the resist layer to an energy source so as to alter at least one of a physical property and a chemical property of the exposed regions; (3) performing a hardening process on the resist layer to increase the etch resistance of first regions of the resist layer relative to second regions of the resist layer, the hardening process including exposing the resist layer to one or more reactive species within an atomic layer deposition (ALD) chamber; and (4) dry etching the resist layer to remove the one or more second regions and to form a pattern in the resist layer.

In some embodiments, a method of patterning a substrate is provided that includes (1) forming a resist layer on a substrate; (2) exposing one or more regions of the resist layer to an energy source so as to alter at least one of a physical property and a chemical property of the exposed regions; (3) developing the resist layer to pattern the resist layer; (4) performing a hardening process on the patterned resist layer to increase the etch resistance of the patterned resist layer, the hardening process including exposing the patterned resist layer to one or more reactive species within an atomic layer deposition (ALD) chamber; and (5) at least one of irradiating the substrate with ultraviolet light and vibrating the substrate during at least a portion of the hardening process.

In some embodiments, a processing system configured to process a substrate is provided that includes (1) a transfer chamber having (a) a plurality of sides each configured to couple to at least one processing chamber; and (b) a substrate handler configured to transport substrates between processing chambers coupled to the transfer chamber; (2) an atomic layer deposition chamber (ALD) coupled to the transfer chamber; (3) an etch chamber coupled to the transfer chamber; and (4) a controller coupled to the transfer chamber and configured to control operation of the processing system to (a) transfer a substrate into the ALD chamber, the substrate having a patterned resist layer formed on the substrate; (b) perform a hardening process on the patterned resist layer in the ALD chamber to increase the etch resistance of the patterned resist layer, the hardening process including exposing the patterned resist layer to one or more reactive species within the ALD chamber and at least one of irradiating the substrate with ultraviolet light and vibrating the substrate during at least a portion of exposing the patterned resist layer to one or more reactive species within the ALD chamber; (c) transfer the substrate to the etch chamber; and (d) etch the substrate within the etch chamber to pattern the substrate.

In some embodiments, a processing system configured to process a substrate is provided that includes (1) an atomic layer deposition chamber (ALD) configured to perform a hardening process on a substrate having a resist layer formed on the substrate with one or more exposed regions of the resist layer at least one of physically and chemically altered by exposure to at least one of ultra-violet light, extreme-ultra-violet light and an electron beam, the hardening process increasing the etch resistance of first regions of the resist layer relative to second regions of the resist layer; (2) an etch chamber configured to receive the substrate from the ALD chamber and to etch the resist layer to remove the one or more second regions and to form a pattern in the resist layer; and (3) a controller configured to control operation of the processing system to (a) transfer the substrate into the ALD chamber; (b) perform the hardening process on the resist layer in the ALD chamber by exposing the resist layer to one or more reactive species within the ALD chamber; (c) transfer the substrate to the etch chamber; and (d) etch the resist layer within the etch chamber to remove the one or more second regions of the resist layer.

In some embodiments, a method of patterning a substrate is provided that includes (1) forming a resist layer on a substrate, the resist layer formed from two or more polymer materials using a self-assembly process; (2) performing a hardening process on the resist layer to increase the etch resistance of first polymer regions of the resist layer relative to second polymer regions of the resist layer, the hardening process including exposing the resist layer to one or more reactive species within an atomic layer deposition (ALD) chamber; (3) at least one of irradiating the substrate with ultraviolet light and vibrating the substrate during at least a portion of the hardening process; and (4) dry etching the resist layer to remove the one or more second polymer regions and to form a pattern in the resist layer.

Numerous other aspects are provided. Other features and aspects of the present invention will become more fully apparent from the following detailed description, the appended claims and the accompanying drawings.

DETAILED DESCRIPTION

Figure 1:
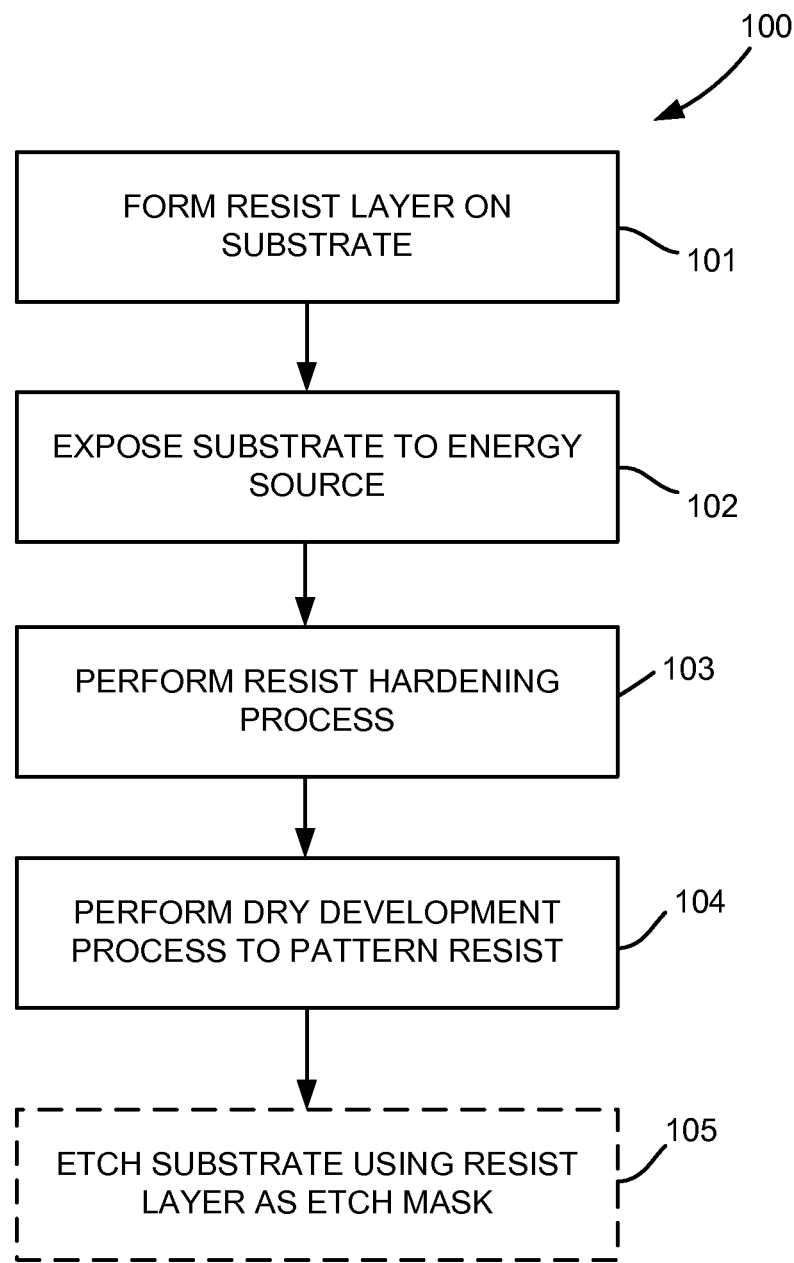
FIG. 1 illustrates a flowchart of a first method of transferring a pattern into a substrate provided in accordance with embodiments of the present invention.

Current lithography employed for semiconductor device manufacturing employs primarily four steps. These steps include (1) photoresist or "resist" coating; (2) exposure; (3) wet development; and (4) etch.

During resist coating, a substrate is coated with a layer of resist, typically using a spin-on process in which resist material is deposited on a top surface of a spinning substrate. Rotation of the substrate causes the resist material to uniformly spread across the top surface of the substrate. In conventional resists, the solubility of the resist material is changed by exposure to light or other energy through a mask pattern so that the mask pattern emerges in the resist layer upon wet development (e.g., much like a photograph). For instance, a chemically amplified resist (CAR) may include a photo-acid generator (PAG) which undergoes a photo-chemical reaction upon exposure to an energy source such as 193 nanometer light, an electron beam (e-beam), extreme ultraviolet (EUV) light, or the like. The photo-chemical reaction may produce an acid within exposed regions of the resist which alters polymer groups within the resist to create a dissolution rate contrast in the resist when the resist is exposed to a wet developer. Other mechanisms may be employed to create dissolution rate contrasts in resist materials. For example, in some resists, exposure to an appropriate energy source may render the resist less likely to dissolve in a wet developer.

During exposure, the substrate is illuminated with light or another energy source through a mask to selectively expose regions of the resist to the energy source. The exposed regions of the resist are chemically altered as described above.

During wet development, the exposed resist layer is placed in a wet chemical bath (e.g., developer) to selectively remove the resist material. For positive resist, the material exposed to light is removed by the developer; while for negative resist, the material not exposed to light is removed by the developer. This process transfers the pattern of the mask into the resist layer.

Following development, the resist layer is employed as an etch mask to transfer the pattern formed in the resist layer into the substrate (either directly or through use of one or more hard masks).

Conventional lithography processes as described above may suffer from several drawbacks. For instance, wet development of resists may produce a pattern having resist line-edge-roughness (LER) due to an acid gradient at mask edges. This may cause uncertainty in predicting line edges that result following wet development. Additionally, as device dimensions shrink below 22 nanometers, capillary forces due to the small feature size may cause pattern collapsing during wet development and cleaning processes. Wet developed resist materials also may have poor etch resistivity such that multiple hardmasks may be employed during device fabrication. This is particularly true during formation of deep trenches such as through-silicon via (TSV) etch steps, or when a thin EUV resist is employed.

Embodiments of the present invention provide methods of performing lithography using a dry development process with a hardened resist layer. For example, the dry development process may be a dry etch process, such as a reactive ion etch process. In some embodiments, a resist layer is selectively hardened, and a mask pattern is transferred to the resist layer employing a plasma etch process.

Use of such a dry development process may overcome many of the above-mentioned shortcomings. For example, employing a dry development process in place of a wet development process may improve LER and reduce pattern collapse. In other embodiments, a wet development process may be employed during formation of a hardened resist layer.

Use of a hardened resist layer may reduce the number of processing steps employed by reducing the use of some hard mask layers, and in some embodiments, allowing both the hardened resist layer and an underlying layer to be etched in a single etch chamber. Such hardened resist layers also may have sufficient etch resistivity to enable deep trench etching without additional hard mask layers. These and other embodiments are described below with reference to FIGS. 1-5.

FIG. 1 illustrates a flowchart of a first method 100 of transferring a pattern into a substrate provided in accordance with embodiments of the present invention. Method 100 is explained with reference to FIGS. 2A-2F which illustrate schematic cross-sectional views of a substrate processed using method 100.

Figure 2A:
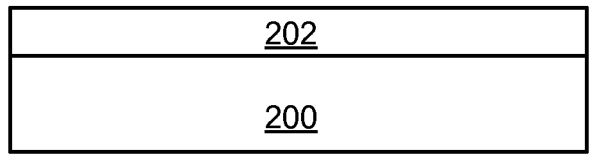
FIGS. 2A-2F illustrate schematic cross-sectional views of a substrate processed using the method of FIG. 1 in accordance with embodiments of the present invention.

With reference to FIG. 1 and FIG. 2A, a substrate 200 (FIG. 2A) is provided that includes a material layer 202 to be etched. The substrate 200 may be any suitable substrate such as a silicon or other semiconductor wafer, a glass plate or the like. The material layer 202 may be a portion of the substrate 200, or a separate layer such as a conductive layer, an insulating layer, another semiconductor layer, etc., and may be of any suitable thickness. The substrate 200, material layer 202 and other layers described herein are not drawn to scale.

Figure 2B:
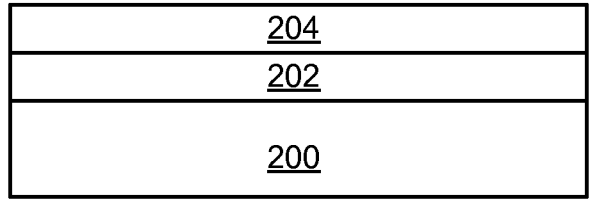

In Block 101 (FIG. 1), a resist layer 204 is formed on the substrate 200 as shown in FIG. 2B. The resist layer 204 is a material layer that undergoes a chemical and/or physical property change when exposed to an energy source such as ultra-violet (UV) light, extreme-ultra-violet (EUV) light or an electron beam. For example, when a region of the resist layer 204 is exposed to one of the above energy sources, chemical bonds within the exposed region may be formed or broken, film density may change and/or the like. As a non-limiting example, the resist layer 204 may be a poly(methylmethacrylate) (PMMA) resist which includes C═O, C═N or other groups which may be disrupted by exposure to UV, EUV or e-beam energy. Other resists such as polystyrene-b-poly(methyl methacrylate) (PS-b-PMMA), polyhydroxystyren acrylic polymers, etc., may be employed and/or other properties such as polarity, density, bonding structure, etc., may be modified by a suitable exposure process.

In some embodiments, the resist layer 204 may be a PMMA-based resist layer having a thickness of about 150 to about 30,000 angstroms. Thinner or thicker resist layers may be employed. Because of the hardening process employed (as described below), a relatively thin layer of resist may be employed and still provide sufficient etch resistance.

A post-coating resist bake may be employed in some embodiments. For example, solvents may be present in the resist to facilitate uniform spreading of the resist layer across the substrate 200. As such, baking the substrate 200 following resist coating may drive off the solvents and "cure" the resist prior to exposure. As an example, the substrate 200 may be baked at a temperature of about 100° C. for about 1 minute in ambient air environment. Any suitable post-coating/pre-exposure bake temperature and/or environment may be employed.

Figure 2C:
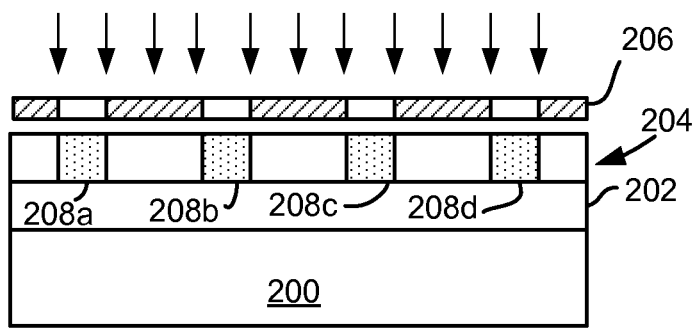
Figure 2D:
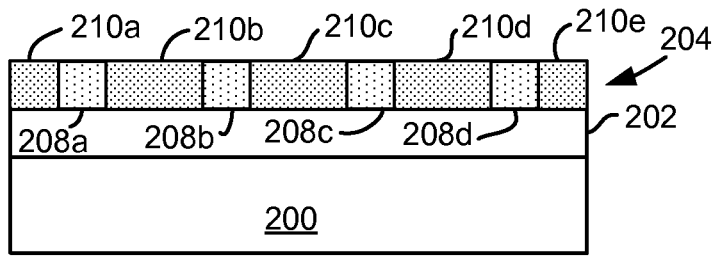

In Block 102 the resist layer 204 is exposed to an energy source such as UV light, EUV light or an e-beam. With reference to FIG. 2C, a mask 206 may be placed proximate the resist layer 204. For example, the mask 206 may be placed in contact with or a short distance from the resist layer 204. The mask 206 includes transparent and opaque regions which selectively allow light energy (or another energy type) to pass through the mask 206 and expose one or more regions of the resist layer 204 (as indicated by the shaded regions 208a-d in resist layer 204). In one example embodiment, the resist layer 204 may be exposed to light having a wavelength of about 13.5 nanometers (EUV) or about 193 or 248 nanometers (UV) at a dose on the order of about 1-30 $mJ/cm^2$. Other wavelengths and/or doses may be employed.

As described, exposed regions of the resist layer 204 undergo a chemical and/or physical change. For example, when a PMMA resist is employed for resist layer 204, exposed regions of the resist layer 204 may have a smaller density of C=O, C=N or other groups following exposure. As will be described below, in some embodiments, subsequent processing of the resist layer 204 may increase the etch resistance of non-exposed regions 210a-e (FIG. 2D) of the resist layer 204 relative to exposed regions 208a-d of the resist layer 204. In other embodiments, subsequent processing of the resist layer 204 may increase the etch resistance of exposed regions 208a-d of the resist layer 204 relative to non-exposed regions 210a-e of the resist layer 204.

In Block 103 a hardening process is performed on the exposed resist layer 204. In some embodiments, the substrate 200 is loaded into an atomic layer deposition (ALD) chamber and exposed to one or more reactive species to selectively harden the resist layer 204. For example, the resist layer 204 may be exposed to a metal precursor within the ALD chamber to increase the etch resistance of non-exposed regions 210a-e of the resist layer 204 relative to exposed regions 208a-d of the resist layer 204 (or vice versa). Example metal precursors include sources of aluminum, titanium, zinc, tungsten, silicon, hafnium, zirconium and/or other metals and/or similar materials.

In one example embodiment, trimethylaluminum (TMA) and water may be deposited on the resist layer 204 using either a sequential or simultaneous deposition/etch ALD process. For example, in a sequential process, TMA may be employed to expose the resist layer 204 to aluminum, and to incorporate aluminum in the resist layer 204. Water or another oxygen source may then be employed to oxidize the aluminum and form aluminum oxide ($Al_2O_3$) within the resist layer 204. In some embodiments, TMA may be supplied for less than about 1 second to about 600 seconds at a pressure of about 1 to about 50 Torr and at a substrate temperature of about 60 to about 150° C. Water may be supplied for less than about 1 second to about 600 seconds at a pressure of about 1 to about 50 Torr and at a substrate temperature of about 60 to about 150° C. Other metal precursors and/or process conditions may be employed.

In some embodiments, use of a metal source such as TMA and water for hardening the resist layer 204 may be time consuming, as multiple cycles of TMA and water purge are employed to fully and/or adequately harden the resist layer 204. In such embodiments, the mechanism for absorption, diffusion and desorption reactions during the exposure-purge-exposure-purge cycle may be complicated. To improve throughput, a furnace-based or other batch process may be employed.

In other embodiments, irradiation may be employed to assist the resist hardening process. For example, during metal source (e.g., TMA) exposure, additional irradiation may be introduced to facilitate more bonding reactions (e.g., through absorption and/or photochemical reaction). The bonding energy of the resist polymer chain may change upon irradiation and create new TMA bonding/nucleation sites. In addition, irradiation may also generate new C=O or other bonds, or in some embodiments, reduce the number of C=O or other bonds.

Irradiation during the resist hardening process may serve as a catalyst for, or otherwise facilitate, reactions between a precursor and the resist. In some embodiments, this may allow resist hardening without or with a reduced amount of a second reactant such as water and/or reduce out-diffusion during pumping between precursor soaking events. Additionally, by employing irradiation to catalyze reaction between the precursor and resist, full diffusion of the precursor through both the surface and bulk of the resist can occur prior to precursor-resist reaction; otherwise, surface reactivity between precursors and the resist may form a diffusion barrier to the bulk regions of the resist.

In this manner, irradiation during resist hardening may provide an additional variable during resist design, and/or may reduce and/or eliminate the use of multiple cycles of precursor exposure, such as TMA and $H_2O$ exposure. In some embodiments, oxide formation may progress within the resist with reduced water exposure, and in some embodiments without water exposure, as irradiation during resist hardening may provide a sufficient bonding reaction for oxide formation. Such a process may behave more like a chemical vapor deposition process than an atomic layer deposition process.

Wavelengths that may be employed to facilitate resist hardening will depend on numerous factors such as the bonding energy and reactivity of the carbonyl structure or other chemical bond structure of the resist employed (e.g., carbon-nitrogen bond structure). For example, for many resist chemical structures, ultraviolet light may be suitable. Strong absorption bands may include wavelength ranges from about 180-190 nm, about 210-230 nm, about 275-295 nm and/or about 310-380 nm. Corresponding to these wavelengths are irradiation sources that include excimer lasers (e.g., ArF, KrF), mercury lamps, Aluminum Nitride light emitting diodes (LEDs) (e.g., about 210 nm), Gallium Nitride LEDs (e.g., about 240-340 nm), AlGaN LEDs, fiber lasers and/or second-harmonics, third-harmonics or fourth-harmonics of longer wavelength lasers such as blue diode or Ti-sapphire lasers. Other wavelengths and/or irradiation sources, and/or combinations of multiple wavelengths, may be employed.

In some embodiments, a light source may be positioned within an ALD chamber, such as above a substrate support to provide irradiation to a resist layer during resist hardening. In other embodiments, the ALD chamber may be provided with a window or transparent port, such as in a lid of the ALD chamber, through which light may be transmitted onto a substrate/resist layer during resist hardening. Other light source locations may be employed, as may arrays of light sources such as an array of suitable wavelength LEDs, moveable light sources which scan the resist layer and/or the like.

Light may be applied to the substrate during all or a portion of the hardening process. For example, light may be applied to the resist layer while a metal precursor is introduced to the resist layer and/or while water or another oxidizing precursor is introduced to the resist layer. Any suitable duration of illumination may be employed (e.g., during an initial portion of precursor flow, after a predetermined duration of precursor flow, during the entire precursor flow, etc.).

In some embodiments, vibrational and/or thermal energy may be introduced during the resist hardening process to induce reactivity between precursors (e.g., TMA and water) and/or polymers within the resist. For example, ultrasonic vibration and thermal irradiation can both create energy to facilitate reactions.

In some embodiments, the substrate may be supported on a piezoelectric or other suitable transducer during resist hardening. A sonic, ultrasonic, megasonic or other frequency power source may be employed to vibrate the transducer and the substrate. Example vibrational frequencies range from about 1 kiloHertz to about 20+ megaHertz, although other frequencies may be employed. Alternatively or additionally, vibrational energy may be supplied to the precursor(s) in some embodiments. Vibrational energy may be constant or pulsed on and off if desired. Any suitable duration of vibration may be employed (e.g., during an initial portion of precursor flow, after a predetermined duration of precursor flow, during the entire precursor flow, etc.).

In some embodiments, vibrational energy may be employed to facilitate diffusion of precursor(s) through the resist polymer matrix, so that more polymer reaction sites may be accessed by the diffusing precursor. For example, ultrasonic vibration may create atomic vibrational states that open diffusion paths for precursors such as TMA to migrate to and react with otherwise inaccessible carbonyl groups. This may increase the volume fraction of hardening reactions and create denser conversions on a single precursor cycle.

Because of the chemical and/or physical changes made to the exposed regions 208a-d of the resist layer 204, in some embodiments, the exposed regions 208a-d incorporate less metal oxide than the non-exposed regions 210a-e. As such, following ALD processing, more metal oxide is formed in non-exposed regions 210a-e of the resist layer 204, rendering these regions more etch resistant. (In other embodiments, following ALD processing, more metal oxide may be formed in exposed regions 208a-d of the resist layer 204, rendering these regions more etch resistant.)

Following resist hardening, in some embodiments, a post resist-hardening bake or anneal may be performed. For example, the substrate 200 may be heated to a temperature of between about 50-110° C. for about 20 seconds to about 2 minutes in ambient air. Other bake times, temperatures and/or environments may be employed.

Figure 2E:
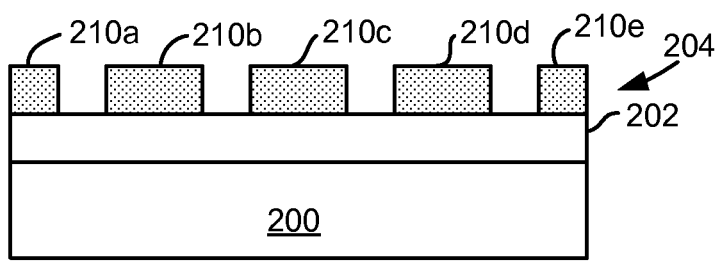

In Block 104, a dry development process is performed to pattern the resist layer 204. For example, the resist layer 204 may be subjected to a dry etch process in a reactive ion etch chamber, or other etch chamber, to selectively remove the exposed regions 208a-d of the resist layer 204. As stated, in some embodiments, the exposed regions 208a-d of the resist layer 204 may incorporate less metal oxide during an ALD hardening process (Block 103) and are much less etch "hardened". Etching of the exposed regions 208a-d of the resist layer 204 occurs at a higher rate than the non-exposed regions 210a-e, allowing the exposed regions 208a-d to be removed as shown in FIG. 2E. (In other embodiments, the non-exposed regions may etch faster and be removed (not shown).)

In some embodiments, the resist layer 204 may be etched in a Centura Advantage Mesa Etch chamber, available from Applied Materials, Inc. of Santa Clara, Calif. Example etch species include HBr, $Cl_2$, $O_2$, $SF_6$, $CH_4$, $CF_4$, $N_2$, or the like. In one example embodiment, the resist layer 204 may be etched in 50 sccm of $O_2$ for about 30 seconds. In some embodiments, an $Al_2O_3$ or similar oxide layer may form on top of the resist layer 204 and may be etched using an oxide breakthrough etch step (e.g., using a $Cl_2/BCl_3$ etch step, for example) prior to resist etch. Example etch parameters for the resist etch are RF power of about 50 to 1000 Watts, and a substrate temperature of about room temperature to about 100° C. Other etch species and/or process parameters may be employed. Post-etch clean steps may be employed if desired.

In some embodiments, following dry development of the resist layer 204, in Block 105 the substrate 200 (e.g., material layer 202 formed on substrate 200) may be etched using the patterned resist layer 204 as an etch mask. Because the resist layer 204 has been hardened, in some embodiments, the material layer 202 may be etched without the use of an additional hard mask. The material layer 202 may be etched via any suitable process such as a wet or dry etch process. In some embodiments, the resist layer 204 and material layer 202 may be etched in the same etch chamber, and in some cases using the same etch process. In other embodiments, a separate etch process and/or etch chamber may be employed to etch the material layer 202. In other embodiments, the resist layer 204 may be employed to pattern one or more hard mask layers that are subsequently employed to etch/pattern the substrate 200.

Figure 2F:
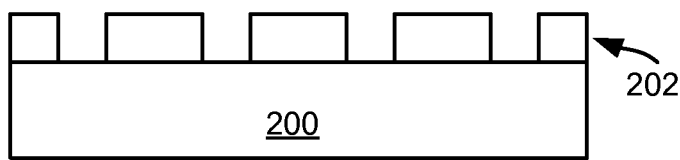

By etching the material layer 202 using the patterned resist layer 204 as an etch mask, the material layer 202 may be patterned as shown in FIG. 2F (which shows the resist layer 204 removed).

Following etching of the material layer 202, the resist layer 204 may be removed from the substrate 200. In some embodiments, the resist layer 204 may be removed using a wet strip. For example, if the resist layer 204 is a PMMA resist, the resist layer 204 may be removed using a PMMA resist wet developer as the etchant (e.g., tetra-methylammonium-hydroxide (TMAH) under ambient conditions). The resist layer 204 also may be removed using a wet aluminum etchant such as an aqueous mixture of $H_3PO_4$, $CH_3COOH$ and $HNO_3$. In other embodiments, the resist layer 204 may be removed using a dry etch process such as an $Al_2O_3$ etch employing $BCl_3$ and $Cl_2$. Other resist removal processes may be employed.

Use of a dry development process for the resist layer 204, such as a dry etch process, may overcome many shortcomings of a wet development process. For example, employing a dry development process in place of a wet development process may improve LER and reduce pattern collapse which may occur during wet development. Additionally, use of a hardened resist layer may reduce the number of processing steps employed by reducing the need for some hard mask layers, and in some embodiments, allowing both dry development and substrate etching to be performed in a single etch chamber. Such dry developed, hardened resist layers may have sufficient etch resistivity to enable deep trench etching without additional hard mask layers.

Figure 3:
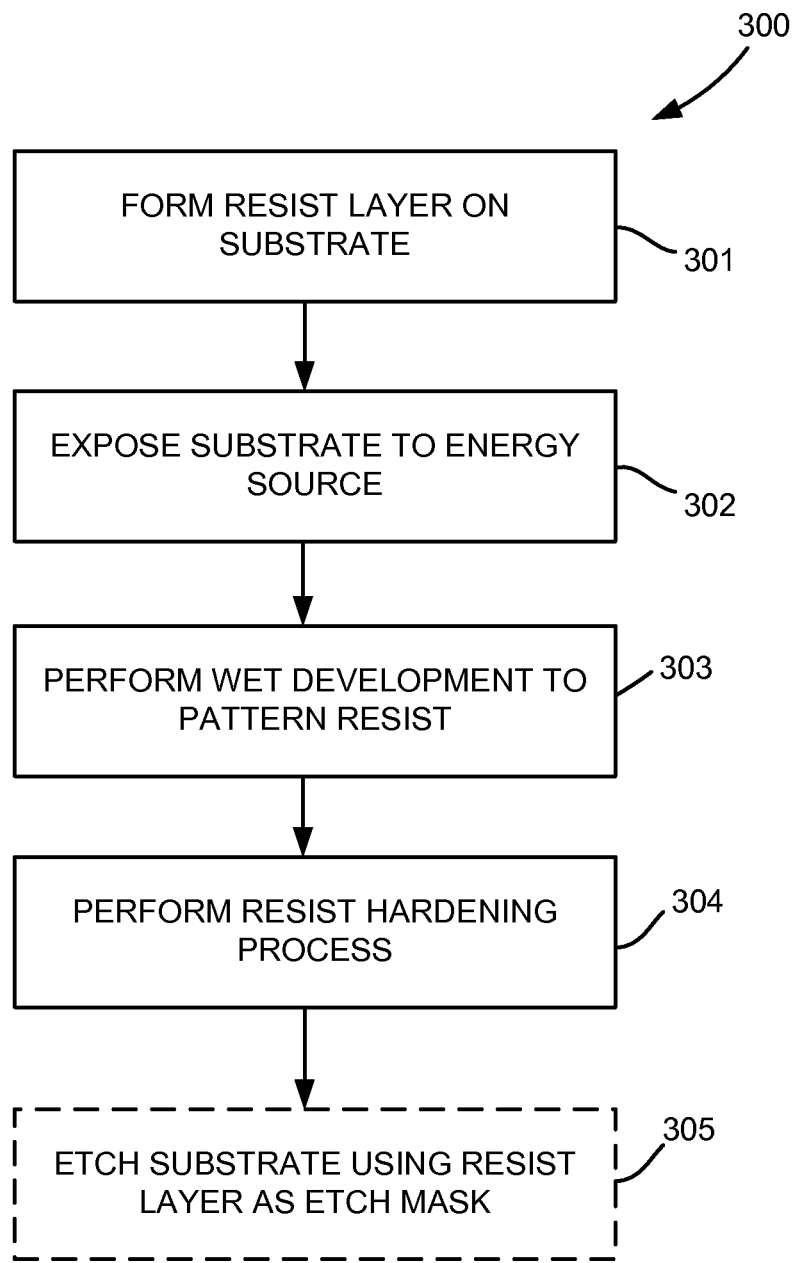
FIG. 3 illustrates a flowchart of a second method of transferring a pattern into a substrate provided in accordance with embodiments of the present invention.

FIG. 3 illustrates a flowchart of a second method 300 of transferring a pattern into a substrate provided in accordance with embodiments of the present invention. The method 300 of FIG. 3 is similar to the method 100 of FIG. 1, but employs a wet development process for the resist layer.

With reference to FIG. 3, in Block 301 a resist layer is formed on a substrate and in Block 302 the resist layer is exposed as previously described with reference to Blocks 101 and 102 of method 100. In Block 303, the substrate is placed in a wet developer to remove exposed regions of the resist layer if a positive resist is employed or non-exposed regions of the resist layer if negative resist is employed. The wet developer and wet development process employed may be selected based on the resist employed (e.g., using the developer recommended by the resist manufacturer, for example).

Following resist development, the resist layer will be patterned. In Block 304, the patterned resist layer is subjected to a resist hardening process that may be similar to any of the resist hardening processes described previously with reference to Block 103 of FIG. 1. For example, the substrate may be loaded into an ALD chamber and exposed to a metal precursor and/or oxidizing agent for one or more cycles, with or without UV radiation and/or mechanical vibration as previously described. Following resist hardening, in Block 305, the substrate may be etched using the hardened, patterned resist layer as an etch mask.

Figure 4A:
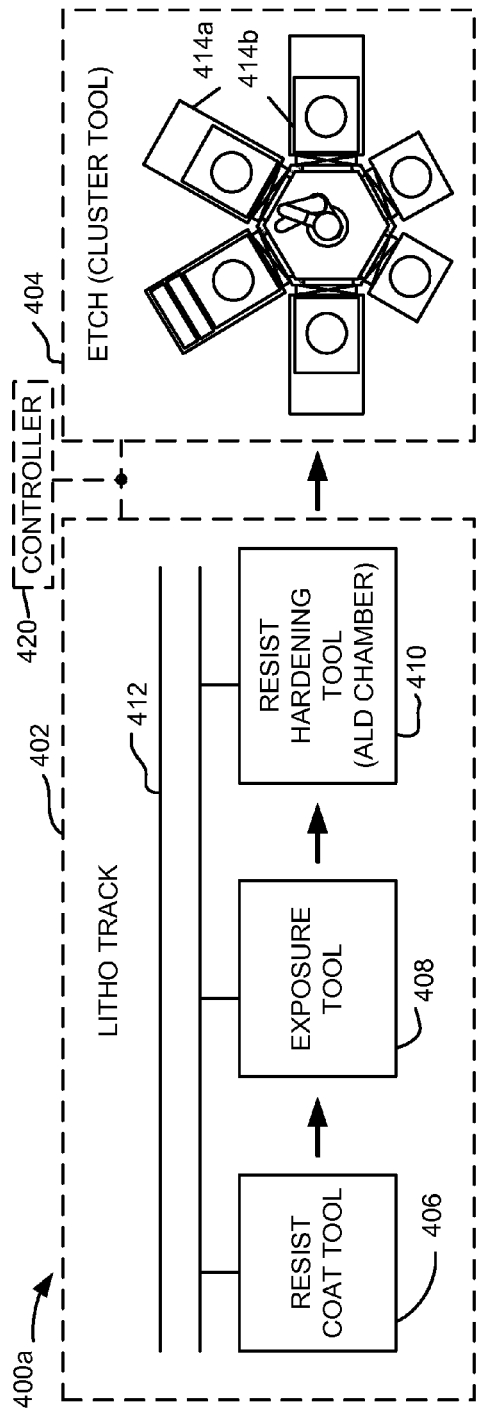
FIG. 4A is an example processing system for carrying out the method of FIG. 1.

FIG. 4A is a schematic diagram of a first processing system 400a configured to process a substrate in accordance with method 100 of FIG. 1. With reference to FIG. 4A, the processing system 400a includes a lithography track (litho-track) subsystem 402 and a cluster tool subsystem 404. The litho-track subsystem 402 includes a resist coating tool 406 coupled to an exposure tool 408 and an ALD chamber 410 via a transfer mechanism (e.g., track 412). The cluster tool subsystem 404 includes one or more etch chambers 414a, 414b (e.g., plasma etch chambers such as reactive ion etch chambers).

In operation, a substrate may be coated with a resist layer in resist coating tool 406 (e.g., by spin coating), the resist layer may be exposed in exposure tool 408 (e.g., using UV, EUV or e-beam exposure), and the exposed resist layer may be hardened in ALD chamber 410 (e.g., exposed to a reactive species such as metal precursor and/or oxidizing agent for one or more cycles, with or without UV radiation and/or mechanical vibration) as described previously with reference to Block 103 of method 100.

The substrate then is transferred to the cluster tool subsystem 404 and loaded into etch chamber 414a. An etch process then may be performed to dry etch/develop the resist layer. Specifically, non-hardened portions of the resist layer are removed to pattern the resist layer (Block 104 of method 100). The substrate then may be etched in the same or a different etch chamber using the patterned resist layer as an etch mask (Block 105 of method 100).

Figure 4B:
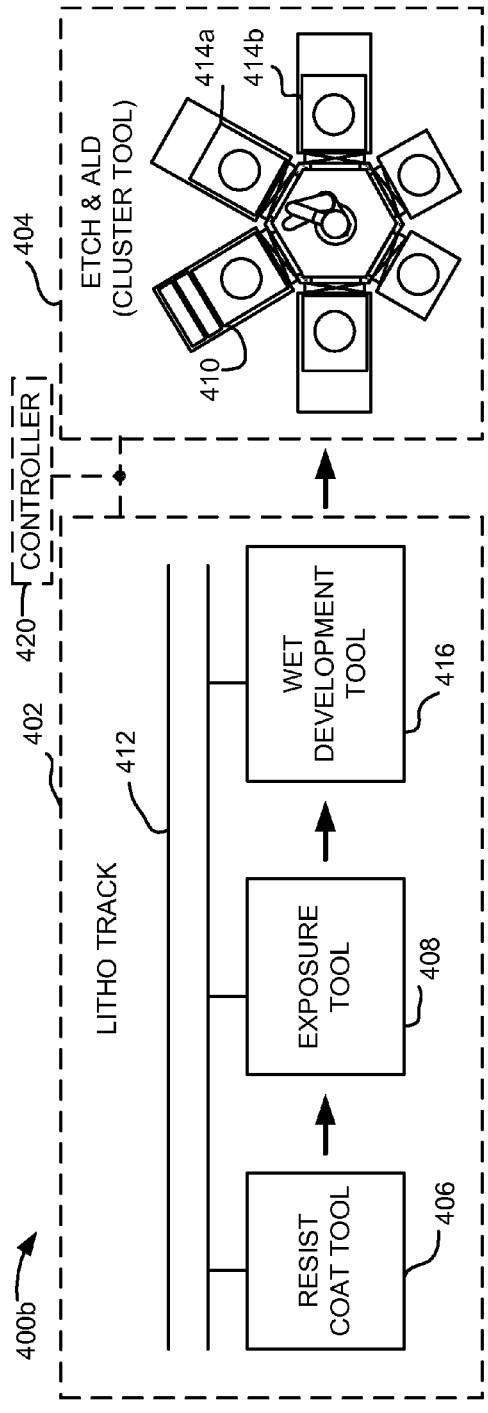
FIG. 4B is an example processing system for carrying out the method of FIG. 3.

FIG. 4B is a schematic diagram of a second processing system 400b configured to process a substrate in accordance with method 300 of FIG. 3. With reference to FIG. 4B, the processing system 400b includes the lithography track (litho-track) subsystem 402 and the cluster tool subsystem 404. The litho-track subsystem 402 includes resist coating tool 406 coupled to exposure tool 408. However, in the embodiment of FIG. 4B, the ALD chamber 410 is removed from the litho track subsystem 402 and is replaced by a wet development tool 416 (e.g., a wet bench or other suitable system). The cluster tool subsystem 404 includes the ALD chamber 410 and one or more etch chambers 414a, 414b.

In operation, a substrate may be coated with a resist layer in resist coating tool 406 (e.g., by spin coating), the resist layer may be exposed in exposure tool 408 (e.g., using UV, EUV or e-beam exposure), and the exposed resist layer may be wet developed in wet development tool 416 to pattern the resist layer. The substrate then is transferred to the cluster tool subsystem 404 and is loaded into ALD chamber 410 and the patterned resist layer is hardened (e.g., exposed to a metal precursor and/or oxidizing agent for one or more cycles, with or without UV radiation and/or mechanical vibration) as described previously with reference to Block 304 of method 300.

The substrate then is transferred to etch chamber 414a. An etch process then may be performed to etch and pattern the substrate using the hardened resist layer as an etch mask (Block 305 of method 300).

In some embodiments, a controller 420 may be provided for controlling or otherwise directing the processing system 400a of FIG. 4A and/or the processing system 400b of FIG. 4B in accordance with at least a portion of the methods described herein (e.g., the method 100 of FIG. 1, the method 300 of FIG. 3, etc.). For example, the controller 420 may be an appropriately programmed microprocessor or microcontroller, hardware circuitry, a combination thereof, etc., having computer program code, that is programmed and/or that is otherwise configured to control and/or initiate one or more portions of the methods described herein, such as method 100 of FIG. 1 or method 300 of FIG. 3.

Figure 5:
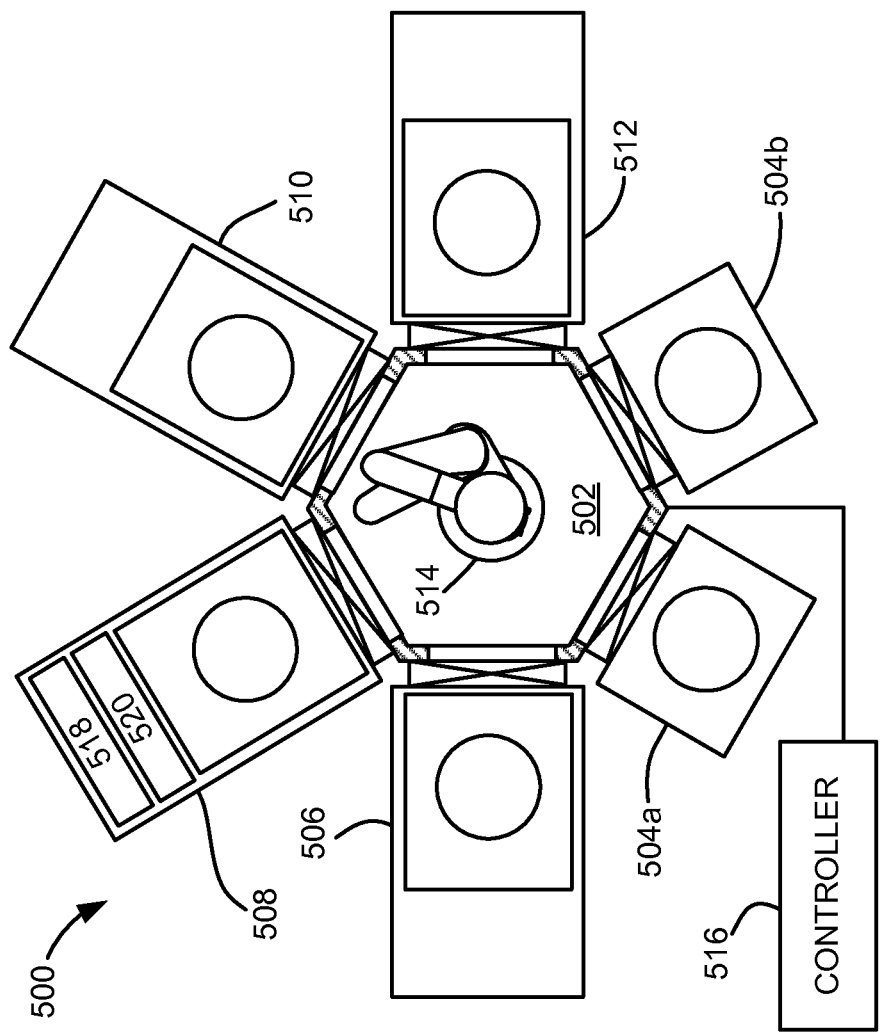
FIG. 5 is a schematic top view of another example processing system configured to process a substrate in accordance with embodiments of the present invention.

FIG. 5 is a schematic top view of an example processing system 500 that may be employed as the cluster tool subsystem 404 of FIG. 4B. With reference to FIG. 5, the processing system 500 is configured to process a substrate in accordance with embodiments of the present invention. The processing system 500 includes a transfer chamber 502 having a plurality of sides or "facets" configured to couple to processing chambers, load lock chambers and the like. In the embodiment of FIG. 5, the transfer chamber 502 has six sides and is hexagonal shaped. Other shapes and/or numbers of sides may be employed (e.g., 4, 5, 8, etc.).

In the embodiment of FIG. 5, two load lock chambers 504a, 504b and four processing chambers 506, 508, 510 and 512 are coupled to the transfer chamber 502. Fewer load lock chambers and/or processing chambers may be employed.

The transfer chamber 502 includes a substrate handler 514 configured to transfer substrates between the load lock chambers 504a, 504b and processing chambers 506-512. The substrate handler 514 may be, for example, a single or dual blade robot, or any other suitable substrate handler.

A controller 516 may be provided for controlling operation of processing system 500. Controller 516 may be an appropriately programmed microprocessor or microcontroller, hardware circuitry, a combination thereof, etc. Controller 516 may be programmed to control operations and/or substrate transfers by substrate handler 514, processing within the processing chambers 506-512, etc. In some embodiments, controller 516 may include computer program code, be programmed and/or otherwise be configured to control and/or initiate one or more portions of the methods described herein, such as method 100 of FIG. 1 or method 300 of FIG. 3.

In one example embodiment, one of the processing chambers such as processing chamber 508 may be an ALD chamber configured to perform a resist hardening process as described herein, and the processing chamber 510 may be an etch chamber configured to etch a hardened resist layer and/or a substrate using a patterned, hardened resist layer as described herein. In one or more embodiments, both resist etching and substrate etching may be performed within the processing chamber 510 using the same or a different etch process and/or etch step. In other embodiments, another processing chamber such as processing chamber 512 may be an etch chamber configured for substrate etching.

The ALD chamber 508 may provide a metal precursor and an oxidizing precursor, such as TMA and water, to a substrate positioned within the ALD chamber 508 during resist hardening. In some embodiments, the ALD chamber 508 may include an irradiation source 518 configured to deliver light energy (e.g., ultra-violet (UV) light) to a substrate during resist hardening within the ALD chamber 508, and/or a vibrational energy source/transducer 520 configured to deliver vibrational energy to the substrate during resist hardening as described previously. For example, a UV light source may be coupled to a lid or sidewall of the ALD chamber 508 and provide UV light through a window or viewport, and/or a transducer may be coupled to and provide vibrational energy to a substrate support, and any substrate supported thereon, during processing within the ALD chamber 508. In some embodiments, ALD chamber 410 of FIGS. 4A and/or 4B may be similarly configured.

While example embodiments of the invention have been described in which TMA and water are employed as precursors during resist hardening, it will be understood that other metal precursors and/or oxidizing precursors may be employed.

In some embodiments, the resist layer 204 may be formed from multiple polymer materials or "domains". For example, the resist layer 204 (latent image) may be formed by a self-assembly (e.g., direct self-assembly (DSA)) process in which two or more polymer materials are employed to form the resist layer. In an example embodiment, PMMA and polystyrene (PS) may be employed to form a resist layer with two domains, a PMMA domain and a PS domain. The above-described hardening process may be employed to harden one domain relative to another domain. In some embodiments, a domain may be hardened in an ALD chamber (e.g., exposed to a metal precursor and/or oxidizing agent for one or more cycles, with or without UV radiation and/or mechanical vibration) as described previously with reference to Block 103 of method 100. A dry etch process then may be employed to selectively remove the non-hardened domain (as described above with reference to method 100).

In some embodiments, a method of forming an etch mask on a substrate is provided that includes (1) forming a resist layer on a substrate; (2) exposing one or more regions of the resist layer to an energy source so as to alter at least one of a physical property and a chemical property of the exposed regions; (3) performing a hardening process on the resist layer to increase the etch resistance of first regions of the resist layer relative to second regions of the resist layer, the hardening process including exposing the resist layer to one or more reactive species within an atomic layer deposition (ALD) chamber; and (4) dry etching the resist layer to remove the one or more second regions and to form a pattern in the resist layer.

In some embodiments, a method of patterning a substrate is provided that includes (1) forming a resist layer on a substrate; (2) exposing one or more regions of the resist layer to an energy source so as to alter at least one of a physical property and a chemical property of the exposed regions; (3) developing the resist layer to pattern the resist layer; (4) performing a hardening process on the patterned resist layer to increase the etch resistance of the patterned resist layer, the hardening process including exposing the patterned resist layer to one or more reactive species within an atomic layer deposition (ALD) chamber; and (5) at least one of irradiating the substrate with ultraviolet light and vibrating the substrate during at least a portion of the hardening process.

In some embodiments, a processing system configured to process a substrate is provided that includes (1) a transfer chamber having (a) a plurality of sides each configured to couple to at least one processing chamber; and (b) a substrate handler configured to transport substrates between processing chambers coupled to the transfer chamber; (2) an atomic layer deposition chamber (ALD) coupled to the transfer chamber; (3) an etch chamber coupled to the transfer chamber; and (4) a controller coupled to the transfer chamber and configured to control operation of the processing system to (a) transfer a substrate into the ALD chamber, the substrate having a patterned resist layer formed on the substrate; (b) perform a hardening process on the patterned resist layer in the ALD chamber to increase the etch resistance of the patterned resist layer, the hardening process including exposing the patterned resist layer to one or more reactive species within the ALD chamber and at least one of irradiating the substrate with ultraviolet light and vibrating the substrate during at least a portion of exposing the patterned resist layer to one or more reactive species within the ALD chamber; (c) transfer the substrate to the etch chamber; and (d) etch the substrate within the etch chamber to pattern the substrate.

In some embodiments, a processing system configured to process a substrate is provided that includes (1) an atomic layer deposition chamber (ALD) configured to perform a hardening process on a substrate having a resist layer formed on the substrate with one or more exposed regions of the resist layer at least one of physically and chemically altered by exposure to at least one of ultra-violet light, extreme-ultra-violet light and an electron beam, the hardening process increasing the etch resistance of first regions of the resist layer relative to second regions of the resist layer; (2) an etch chamber configured to receive the substrate from the ALD chamber and to etch the resist layer to remove the one or more second regions and to form a pattern in the resist layer; and (3) a controller configured to control operation of the processing system to (a) transfer the substrate into the ALD chamber; (b) perform the hardening process on the resist layer in the ALD chamber by exposing the resist layer to one or more reactive species within the ALD chamber; (c) transfer the substrate to the etch chamber; and (d) etch the resist layer within the etch chamber to remove the one or more second regions of the resist layer.

Accordingly, while the present invention has been disclosed in connection with the example embodiments thereof, it should be understood that other embodiments may fall within the spirit and scope of the invention, as defined by the following claims.

The invention claimed is:

1. A method of forming an etch mask on a substrate, the method comprising:
    forming a resist layer on a substrate;
    exposing one or more regions of the resist layer to an energy source so as to alter at least one of a physical property and a chemical property of the exposed regions;
    performing a hardening process on the resist layer to increase the etch resistance of first regions of the resist layer relative to second regions of the resist layer, the hardening process including exposing the resist layer to one or more reactive species within an atomic layer deposition (ALD) chamber and vibrating the substrate during at least a portion of the hardening process; and
    dry etching the resist layer to remove the one or more second regions and to form a pattern in the resist layer.

2. The method of claim 1 wherein the first regions are exposed regions of the resist layer and the second regions are non-exposed regions of the resist layer.

3. The method of claim 1 wherein the first regions are non-exposed regions of the resist layer and the second regions are exposed regions of the resist layer.

4. The method of claim 1 wherein forming the resist layer includes coating the substrate with a photoresist layer having bonds that are broken when exposed to at least one of ultra-violet light, extreme-ultra-violet light and an electron beam.

5. The method of claim 1 wherein exposing one or more regions of the resist layer comprises:
   placing a mask proximate the resist layer; and
   exposing the resist layer to an energy source through the mask.

6. The method of claim 1 wherein performing the hardening process comprises:
   loading the substrate into an ALD chamber; and
   exposing the substrate to a metal precursor within the ALD chamber to increase the etch resistance of first regions of the resist layer relative to second regions of the resist layer.

7. The method of claim 6 wherein the etch resistance of the first regions of the resist layer are increased at both a surface and a bulk region of the resist layer.

8. The method of claim 6 wherein exposing the substrate to the metal precursor includes forming metal oxide within the first regions of the resist layer.

9. The method of claim 1 wherein performing the hardening process includes irradiating the substrate with ultraviolet light during at least a portion of the hardening process.

10. The method of claim 1 wherein dry etching the resist layer includes performing reactive ion etching on the resist layer.

11. The method of claim 1 further comprising etching the substrate using the patterned resist layer as an etch mask.

12. The method of claim 11 wherein dry etching the resist layer and etching the substrate are performed in the same etch chamber.

13. A method of patterning a substrate, the method comprising:
   forming a resist layer on a substrate;
   exposing one or more regions of the resist layer to an energy source so as to alter at least one of a physical property and a chemical property of the exposed regions;
   developing the resist layer to pattern the resist layer; and
   performing a hardening process on the patterned resist layer to increase the etch resistance of the patterned resist layer, the hardening process including exposing the patterned resist layer to one or more reactive species within an atomic layer deposition (ALD) chamber and vibrating the substrate during at least a portion of the hardening process.

14. The method of claim 13 wherein exposed regions of the resist layer are removed during development.

15. The method of claim 13 wherein non-exposed regions of the resist layer are removed during development.

16. The method of claim 13 wherein developing the resist layer includes exposing the resist layer to a wet developer.

17. The method of claim 13 wherein forming the resist layer includes coating the substrate with a photoresist layer having bonds that are broken when exposed to at least one of ultra-violet light, extreme-ultra-violet light and an electron beam.

18. The method of claim 13 wherein performing the hardening process comprises:
   loading the substrate into an ALD chamber; and
   exposing the substrate to a metal precursor within the ALD chamber to increase the etch resistance of the resist layer.

\* \* \* \* \*